United States Patent
Amthor et al.

(10) Patent No.: US 11,249,156 B2
(45) Date of Patent: Feb. 15, 2022

(54) MAGNETIC RESONANCE RADIATION SHIELD AND SHIELDED MAIN MAGNET

(71) Applicant: KONINKLIJKE PHILIPS N.V., Eindhoven (NL)

(72) Inventors: Thomas Erik Amthor, Hamburg (DE); Christoph Leussler, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 765 days.

(21) Appl. No.: 16/095,102

(22) PCT Filed: Apr. 25, 2017

(86) PCT No.: PCT/EP2017/059742
§ 371 (c)(1),
(2) Date: Oct. 19, 2018

(87) PCT Pub. No.: WO2017/186687
PCT Pub. Date: Nov. 2, 2017

(65) Prior Publication Data
US 2020/0355769 A1    Nov. 12, 2020

(30) Foreign Application Priority Data
Apr. 25, 2016    (EP) .................... 16166777

(51) Int. Cl.
*G01R 33/385* (2006.01)
*G01R 33/38* (2006.01)
*G01R 33/3815* (2006.01)

(52) U.S. Cl.
CPC ..... *G01R 33/3856* (2013.01); *G01R 33/3804* (2013.01); *G01R 33/3815* (2013.01); *G01R 33/3858* (2013.01)

(58) Field of Classification Search
CPC ............ G01R 33/3856; G01R 33/3804; G01R 33/3815; G01R 33/3858; G01R 33/3875;
(Continued)

(56) References Cited

U.S. PATENT DOCUMENTS 5,256,969 A   10/1993   Miyajima et al.
5,280,247 A    1/1994   De Meester et al.
(Continued)

FOREIGN PATENT DOCUMENTS

GB    2487813 A      8/2012
JP    06232461 A     8/1994
WO    2016031341 A1  3/2016

OTHER PUBLICATIONS

K. Kominato et al., "Development of Novel Spectroscopic Magnet Combining Mass Spectroscopy With Nuclear Magnetic Resonance," in IEEE Transactions on Applied Superconductivity, vol. 20, No. 3, pp. 736-739, Jun. 2010 (Year: 2010).*
(Continued)

*Primary Examiner* — Daniel R Miller (57) ABSTRACT

The present invention provides a radiation shield (204), in particular for shielding main coils (202) of a magnetic resonance imaging system (110), whereby the radiation shield (204) comprises a cavity (214) for housing at least one main coil (202), whereby the cavity (214) is formed between an inner cylindrical wall (206), an outer cylindrical wall (208), which are arranged essentially concentrically to each other, and two ring-shaped base walls (212), which interconnect the inner cylindrical wall (206) and the outer cylindrical wall (208), wherein at least one out of the inner cylindrical wall (206), the outer cylindrical wall (208), and the two ring-shaped base walls (212) is provided at least partially with an inner layer (216), which faces the cavity (214), and an outer layer (218), wherein the inner layer (216) is a layer comprising carbon fiber reinforced plastic, and the
(Continued)

outer layer (218) comprises a metal, which is paramagnetic or diamagnetic. The present invention also provides a shielded main magnet (200) comprising at least one main coil (200) for generating a static main magnetic field in a magnetic resonance imaging system (110), and a radiation shield (204) as specified above, wherein the at least one main coil (202) is housed in a cavity (214) of the radiation shield (204).

19 Claims, 6 Drawing Sheets (58) Field of Classification Search
CPC ............ G01R 33/3873; G01R 33/3854; G01R 33/4215; G01R 33/387; G01R 33/42
See application file for complete search history.

(56) References Cited

U.S. PATENT DOCUMENTS

| | | | |
|---|---|---|---|
| 5,387,889 A * | 2/1995 | Maeda | H01F 6/04 |
| | | | 335/216 |
| 6,011,454 A | 1/2000 | Huang et al. | |
| 6,501,275 B1 | 12/2002 | Westphal | |
| 7,170,377 B2 | 1/2007 | Jiang et al. | |
| 2002/0196020 A1* | 12/2002 | Dean | G01R 33/3815 |
| | | | 324/318 |
| 2006/0084332 A1 | 4/2006 | Muschelknautz et al. | |
| 2008/0129297 A1 | 6/2008 | Huang et al. | |
| 2010/0200594 A1* | 8/2010 | Husband | G01R 33/3815 |
| | | | 220/560.13 |
| 2011/0012593 A1 | 1/2011 | Shvartsman et al. | |
| 2013/0157865 A1 | 6/2013 | Shen et al. | |
| 2014/0266208 A1 | 9/2014 | Dempsey et al. | |
| 2015/0253401 A1 | 9/2015 | Rapoport | |
| 2016/0116555 A1* | 4/2016 | Nemoto | H01F 6/00 |
| | | | 505/162 |
| 2016/0281933 A1 | 9/2016 | Ham et al. | |

OTHER PUBLICATIONS

M. Arata et al., "Eddy current loss reduction of superconducting magnets for MAGLEV with a multilayer superconducting sheet," in IEEE Transactions on Applied Superconductivity, vol. 7, No. 2, pp. 912-915, Jun. 1997 (Year: 1997).*

Vetter et al "A 4-TESLA Superconducting Whole Body Magnet for MR Imaging and Spectroscopy" IEEE Transactions on Magnetics, vol. 24, No. 2, Mar. 1988 p. 1285-1287.

Shinji Ogihara, Makoto Yamaguchi, Takahito Chiba, Junichi Shimizu, Yoji Okabe and Nobuo Takeda, Evaluation of Thermal Conductivity in Pitch-Based Carbon Fiber Reinforced Plastics, 16th International Conference on Composite Materials, 2007.

P. Banerjee, J. L. Schmidt, Electrical Conductivity Modeling and Validation in Unidirectional Carbon Fiber Reinforced Polymer Composites, 2013.

* cited by examiner

MAGNETIC RESONANCE RADIATION SHIELD AND SHIELDED MAIN MAGNET

CROSS REFERENCE TO RELATED APPLICATIONS

This application is a U.S. national phase application of International Application No. PCT/EP2017/059742, filed on Apr. 25, 2017, which claims the benefit of EP Application Serial No. 16166777.9 filed on Apr. 25, 2016 and is incorporated herein by reference.

FIELD OF THE INVENTION

The invention relates to the field of magnetic resonance imaging systems. In particular, the present invention relates to the area of radiation shielding of a main magnet of magnetic resonance imaging systems.

BACKGROUND OF THE INVENTION

Magnetic resonance (MR) imaging systems are often used for the examination of patients, further referred to in general as subject of interest. In order to examine a body of a subject of interest, typically a patient, using magnetic resonance imaging (MRI) systems, different magnetic fields, which are tuned to one another as precisely as possible with respect to their temporal and spatial characteristics, are radiated onto the subject of interest. Hence, the nuclear spins of body tissue of the subject of interest to be examined are aligned by a static main magnetic field $B_0$. A powerful main magnet generates a powerful static main magnetic field $B_0$, which typically is provided with a magnetic field strength of 1.5 Tesla or 3 Tesla, in some embodiments with a magnetic field strength of more than 3 Tesla. The nuclear spins of atomic nuclei of the subject of interest are excited by magnetic radio-frequency excitation pulses B1 (x, y, z, t), which are radiated into the nuclei via a radio-frequency antenna and/or a local coil arrangement. Still further, high frequency excitation pulses are generated and guided to the radio-frequency antenna.

The MRI system further includes gradient coils, with which magnetic gradient fields $B_G(x, y, z, t)$ are radiated during a measurement for selective slice excitation and for spatial encoding of the measuring signal. Signals emitted by the excited nuclear spins of the atomic nuclei in the subject of interest to be examined are received by at least RF receive coil, amplified, further processed and digitized. The recorded measured data is digitized and stored as complex numerical values in a k-space matrix. An associated MR image may be reconstructed from the k-space matrix containing the complex numerical values by, for example, a multidimensional Fourier transformation.

In MR imaging, relaxation signals are exposed to gradient magnetic fields to localize the resultant resonance. The relaxation signals are received and reconstructed into a single or multi-dimensional image. Furthermore, in MR spectroscopy systems, information about the composition of the tissue, which is carried in the frequency component of the resonance signals, is further evaluated to obtain additional information.

The main magnet comprises a set of main coils, typically superconductive magnet coils, which have to be kept at very low temperature to enable superconduction. Hence, the main coils are mounted within a radiation shield as cryogenic vessel. In order to keep the main coils at superconducting temperature, the main coils are in contact with liquid cryogen. The cryogen is typically provided as liquid having a low boiling temperature, e.g. a boiling temperature of about 4.2 K in case of helium. Cooling of the radiation shield is performed by a cryopump connected through heat conductors at one or several points on its surface. In addition to the main coils, the main magnet typically comprises active shield coils, which are located within the radiation shield and co-axially outside the main coils, and which are electrically connected in a direction opposite to the main coils.

The typical radiation shield is made of aluminum, which acts as a reflector for thermal radiation. However, aluminum is a quite expensive material and prices are expected to rise in future. In state of the art main magnets, the aluminum of the radiation shield has a weight of approximately ~200 kg, so that the radiation shield contributes significantly to system weight of the MR imaging system. A further drawback of the aluminum of the radiation shield is that aluminum has a large thermal load, which increases cool down times of the MR imaging system.

Furthermore, the radiation shield made aluminum is susceptible to Eddy currents induced by gradient switching. Accordingly, switching the gradient coils induces eddy currents in the metal of the radiation shield, which cause dissipation and trigger mechanical vibrations. Furthermore, Eddy currents induced by the main magnetic field during a quench lead to high mechanical forces and stresses, so that a solid mechanical design is required. This makes the design of the main magnet more complex, heavy and expensive. Still further, the Eddy currents create magnetic fields, which may affect image quality of the MR imaging system.

To reduce Eddy currents in a well-conducting radiation shield, e.g. a radiation shield made of aluminum, well-shielded gradient coils are required, which makes the gradient coils expensive and increases weight and complexity of the gradient coils, thereby further increasing the overall weight of the MR imaging system.

The international application WO2015/074809 discloses a radiation screen of Aluminium or Copper. Dry-friction areas are provided to damp mechanical vibrations due to gradient switching.

SUMMARY OF THE INVENTION

It is an object of the invention to provide a radiation shield, in particular for shielding main coils of a magnetic resonance imaging system, a shielded main magnet comprising at least one main coil, a magnetic resonance imaging system, and a method for producing a radiation shield, which overcome at least some of the above disadvantages. In particular, it is an object of the present invention to provide a radiation shield, in particular for shielding main coils of a magnetic resonance imaging system, a shielded main coil comprising at least one main coil, a magnetic resonance imaging system, and a method for producing a radiation shield, which enable an improvement in image quality of a magnetic resonance imaging system and a weight reduction together with enhanced and facilitated cooling of the main coils.

This object is achieved by a radiation shield, in particular for shielding main coils of a magnetic resonance imaging system, whereby the radiation shield comprises a cavity for housing at least one main coil, whereby the cavity is formed between an inner cylindrical wall, an outer cylindrical wall, which are arranged essentially concentrically to each other, and two ring-shaped base walls, which interconnect the inner cylindrical wall and the outer cylindrical wall, wherein at least one out of the inner cylindrical wall, the outer cylindrical wall, and the two ring-shaped base walls is provided at least partially with an inner layer, which faces the cavity, and an outer layer, wherein the inner layer is a layer comprising carbon fiber reinforced plastic, and the outer layer comprises a metal, which is paramagnetic or diamagnetic.

This object is further achieved by a shielded main magnet comprising at least one main coil for generating a static main magnetic field in a magnetic resonance imaging system, and a radiation shield as specified above, wherein the at least one main coil is housed in a cavity of the radiation shield.

This object is still further achieved by a magnetic resonance imaging system comprising a shielded main magnet as specified above.

This object is also achieved by a method for producing a radiation shield, in particular for shielding main coils of a magnetic resonance imaging system, comprising the steps of providing a cavity for housing at least one main coil, whereby the cavity is formed between an inner cylindrical wall, an outer cylindrical wall, which are arranged essentially concentrically to each other, and two ring-shaped base walls, which interconnect the inner cylindrical wall and the outer cylindrical wall, and providing at least one out of the inner cylindrical wall, the outer cylindrical wall, and the two ring-shaped base walls at least partially with an inner layer, which faces the cavity, and an outer layer, wherein the step of providing at least one out of the inner cylindrical wall, the outer cylindrical wall, and the two ring-shaped base walls at least partially with an inner layer comprises the step of providing the inner layer with carbon fiber reinforced plastic, and the step of providing at least one out of the inner cylindrical wall, the outer cylindrical wall, and the two ring-shaped base walls at least partially with an outer layer comprises the step of providing the outer layer with a metal, which is paramagnetic or diamagnetic.

Basic idea of the present invention is to provide a radiation shield, in particular for main coils of a magnetic resonance (MR) imaging system, a shielded main magnet comprising at least one main coil, a magnetic resonance imaging system comprising the above shielded main magnet, and a method for producing a radiation shield, whereby the radiation shield has a two-layer setup with an inner layer comprising carbon fiber reinforced plastic, and the outer layer comprises a metal, which is paramagnetic or diamagnetic. Hence, the radiation shield is based on carbon fiber technology. On the one hand side, carbon fiber reinforced plastic (CFRP) has a thermal conductance similar e.g. to aluminum, which facilitates cooling of the main coils provided within the radiation shield. Heat transfer within the radiation shield is essentially defined by the properties of the CFRP. On the other hand, CFRP materials are bad electrical conductors, which inherently reduces the occurrence of eddy currents. Carbon fiber reinforced plastics provide a high specific modulus and strength. Accordingly, the inner layer comprising CFRP enables provisioning of a radiation shield high rigidity and low weight, so that the overall weight of the radiation shield and thereby of the entire MR imaging system can be reduced. Furthermore, electrical conductivity of CFRP is rather low, in particular compared to e.g. aluminum currently used in radiation shields. Accordingly, the inner layer does not carry significant eddy currents. Furthermore, usage of CFRP enables a manufacturing process for the inner layer of the radiation shield with increased flexibility in the mechanical design. Application of CFRP in the manufacturing process is simple. Hence, carbon fiber composites, i.e. CFRP, offer a combination of high anisotropic thermal conductivity, low anisotropic electrical conductivity, low weight, and high mechanical strength.

Preferably, the inner layer comprises multiple layers of CFRP. The different layers enable an easy manufacturing of the inner layer and a simple adaptation of the shape of the inner layer. Furthermore, mechanical strength and heat dissipation can be controlled based on the different layers of the inner layer of the radiation shield.

The outer layer made of a metal, which is paramagnetic or diamagnetic, provides good reflectivity for thermal radiation, in the same way as the surface of a conventional radiation shield e.g. made of aluminum. The occurrence of Eddy currents is limited to the outer layer, so that influence of magnetic fields based on the occurrence of Eddy currents in the radiation shield can be reduced. The used metal of the outer layer enables good heat reflection and a good thermal coupling to the inner layer. Metals typically provided a good reflection of heat in the entire spectral range of heat irradiation. Paramagnetic as well as diamagnetic are generally suitable, only ferromagnetic metals like iron are excluded, since the effect of ferromagnetic materials on the magnetic fields of the MR imaging system are typically undefined.

Overall, the occurrence of Eddy currents in the radiation shield due to switching the gradient coils can be reduced, so that dissipation and mechanical vibrations can be reduced. In particular, the effect of quenching can be reduced, so that forces induced in the radiation shield can be reduced. Accordingly, requirements in respect to mechanical strength of the radiation shield can be reduced. Furthermore, use of metal in the radiation shield can be reduced, which reduces the weight of the radiation shield and costs. A further drawback of the aluminum walls of the known radiation shield is that aluminum has a large thermal load, which increases cool down times. With the reduction of the Eddy currents in the radiation shield, shielding of the gradient coils can be reduced or even omitted, which makes the construction of the gradient coils cheap and reduces weight and complexity of the gradient coils. Based on the thermal properties of CFRP, cool-down time of the main coils within the radiation shield can be improved. Cooling of the radiation shield is performed by a cryopump connected through heat conductors at one or several points on a cylinder surface of the radiation shield. The thermal conductivity of the carbon fibers enables efficient thermalization. At the same time, the total heat load is less than that of a conventional aluminum cylinder, so that the cool-down time is reduced.

The above advantages become especially important for MR imaging systems with unshielded gradient coils and/or for MR imaging systems applying very high magnetic fields with magnetic field strengths of more than 3T.

According to a preferred embodiment the fibers of the carbon fiber reinforced plastic of the inner layer are commonly aligned in one direction. Because carbon fibers have high thermal conductivity, their composites can be used as heat control materials. Carbon fiber unidirectional composites exhibit an anisotropic thermal conductivity, which is high in fiber direction and low in the direction perpendicular to the fibers. Hence, the longitudinal thermal conductivity can be large with values of even more than 400 W/mK. Hence, thermal conductivity comparable to copper can be achieved in the direction of the fibers. At the same time, the heat capacity of CFRP is typically about 1 J/(gK), which is similar to that of aluminum. Accordingly, when the fibers of the CFRP are aligned in one direction, the inner layer as a whole can be provided with different thermal conductivities for different directions. Accordingly, good thermal isolation of the radiation shield can be provided with improved cooling capabilities.

According to a preferred embodiment at least one out of the inner cylindrical wall and the outer cylindrical wall is provided at least partially with an inner layer, which faces the cavity, and an outer layer, and the fibers of the carbon fiber reinforced plastic of the inner layer are commonly aligned in an axial direction of the respective inner cylindrical wall and the outer cylindrical wall. With the fibers of the CFRP being aligned in the axial direction of the radiation shield, a heat flow from the outside to the connection to the cryopump can be improved. Based on the anisotropic thermal conductivity of carbon fiber unidirectional composites, the good thermal conductivity of the radiation shield in its axial direction can be used for efficient cooling of the main coils within the radiation shield. However, heat transfer in a radial direction of the radiation shield is low based on the low thermal conductivity in the direction perpendicular to the fibers. In particular, cooling means can be provided at the longitudinal ends of the radiation shield to efficiently cool the radiation shield entirely.

According to a preferred embodiment the outer layer is provided as a coating on the inner layer. The coating can be easily applied to the inner layer to form the outer layer directly thereon. This enables a tight mechanical connection between the inner and the outer layer. Furthermore, rigidity of the outer layer is provided by the inner layer, so that the outer layer can have a small thickness. Still further, a good thermal coupling with the inner layer can be achieved by providing the outer layer as a coating directly on the inner layer.

According to a preferred embodiment the outer layer is a layer sputtered on the inner layer. Sputtering can be used to apply thin layers of materials. Alternatively, the outer layer can be applied on the inner layer by first applying a thin layer of a special paint, which enables subsequent electroplating (galvanization) of a metal coating as outer layer.

According to a preferred embodiment the outer layer is a layer made of aluminum or an alloy comprising aluminum. Aluminum is a paramagnetic material with low weight within the group of paramagnetic metals. Furthermore, heat reflection is high and aluminum can be easily processed for providing the outer layer of the radiation shield. Similarly, in an alternative embodiment, the outer layer can be made of copper or silver, or alloys comprising at least one out of copper and silver.

According to a preferred embodiment the outer layer is a layer having a thickness of less than 1 mm, preferable a thickness of less than 100 μm, further preferred a thickness of less than 20 μm. By reducing the thickness of the outer layer, weight and costs of the radiation shield and thereby of the overall MR imaging system can be reduced. It is merely important that the capability to reflect thermal radiation is maintained in the radiation shield. Still further preferred, the outer layer is a layer having a thickness of approximately 10 μm.

According to a preferred embodiment the inner layer is a layer having a thickness of less than 10 mm, preferably a thickness of less than 5 mm, further preferred a thickness of less than 3 mm. In order to achieve good stability of the radiation shield, it is desired to provide the inner layer with a small thickness. Anyhow, it is required to provide a stable radiation shield suitable for mounting e.g. the main coils and the active shield coils, if present, thereto, so that a certain thickness has to be provided. In particular, the thickness of the inner layer can be controlled by providing a different number of internal layers of the CFRP. The thickness does not have to be uniform. The radiation shield can be provided with a different thickness in different areas, e.g. to strengthen the radiation shield as required or to provide a mounting structure e.g. for mounting the main coils, the active shield coils, or other components, which are connected to the radiation shield in a MR imaging system. Typically, the thickness is within the given parameters, even when the thickness is not uniform for the entire inner layer of the radiation shield.

According to a preferred embodiment the outer layer is provided with slits to prevent eddy-currents. The slits provide interruptions of Eddy currents. Preferably, the slits separate the outer layer into individual pieces, which are electrically separated from each other, so that the occurrence of Eddy current can be limited to these pieces. The form, design, and arrangement of the slits can vary as required. I.e. the width of the slits may vary, as well as their length and orientation. The slits can be provided as essentially straight slits, or with any other form. The slits can be provided as interruptions, gaps, or others. Furthermore, individual slits may be arranged relative to each other in different orientation as required. The slits may be arranged relative to each other to intersect with each other. Preferably, the slits are provided as thin slits, thereby preventing eddy currents from evolving and providing a good coverage of the inner layer to reflect thermal radiation. The reduced Eddy-currents reduce induced dissipation and mechanical forces, and improve image quality of the MR imaging system.

According to a preferred embodiment the outer layer of at least one out of the inner cylindrical wall and the outer cylindrical wall is provided with axial slits extending in a longitudinal direction of the radiation shield. The axial slits preferably extend over the entire length of the outer layer. Preferably, the axial slits are spaced apart in the circumferential direction of the radiation shield. Preferably, the axial slits are equally spaced apart in the circumferential direction.

According to a preferred embodiment the outer layer of at least one out of the inner cylindrical wall, the outer cylindrical wall and the two the ring-shaped base walls is provided with annular slits extending in a circumferential direction of the radiation shield. The annular slits can be provided e.g. along the inner and/or outer cylindrical wall. Hence, the annular slits can be spaced apart in the longitudinal direction of the radiation shield. Preferably, the annular slits are equally spaced apart. Furthermore, the annular slits can be provided e.g. along the base walls. In particular, the annular slits can be provided as concentric circles at the base walls.

According to a preferred embodiment the outer layer of at least one of the ring-shaped base walls is provided with radial slits in respect to a center of the respective ring-shaped base wall. The radial slits are suitable to reduce Eddy currents in the base walls of the radiation shield. The radial slits are preferably equally spaced apart in a circumferential direction of the radiation shield.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
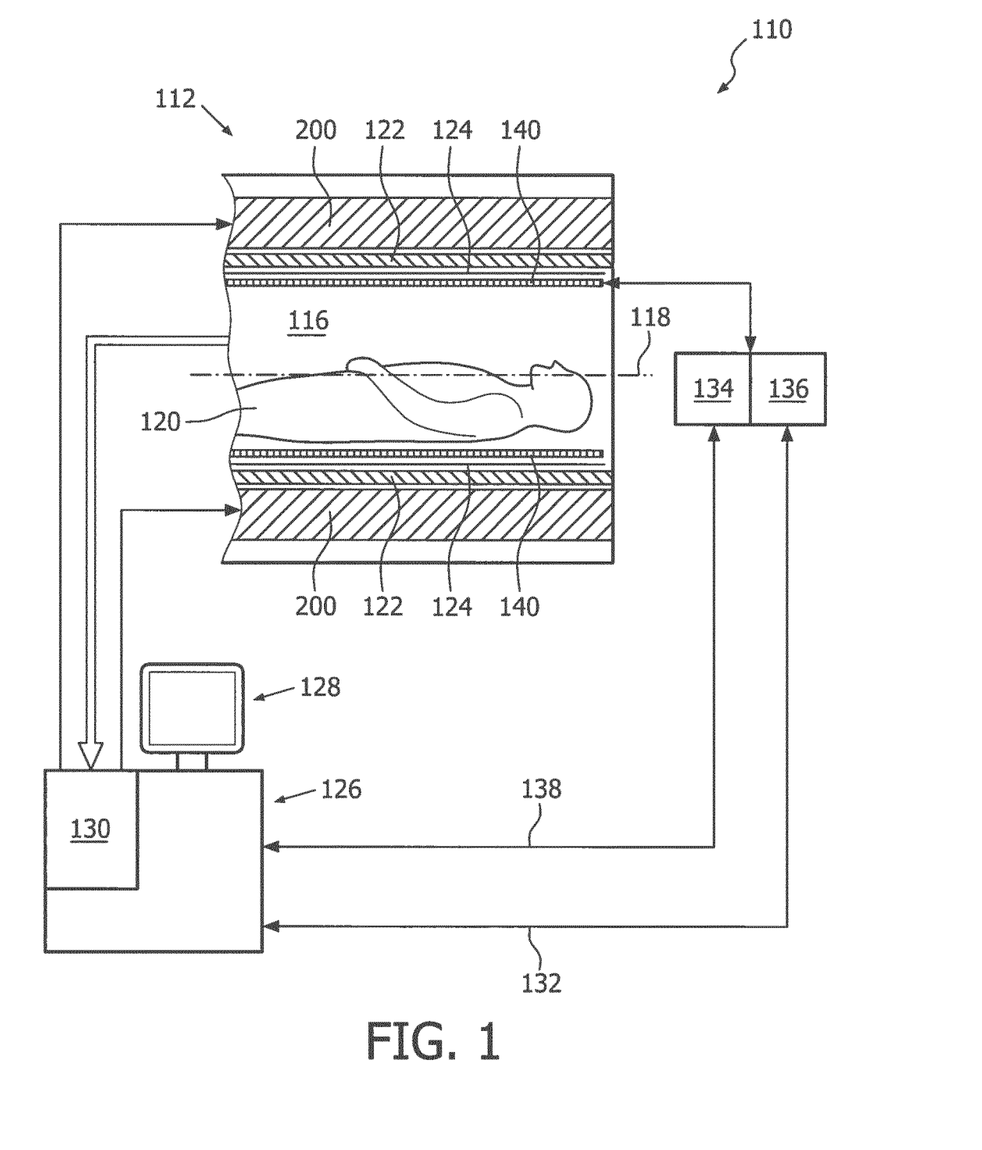
FIG. 1 is a schematic illustration of a part of a generic embodiment of a magnetic resonance (MR) imaging system in accordance with a first embodiment.

FIG. 1 shows a schematic illustration of a part of a magnetic resonance (MR) imaging system 110 according to a first, preferred embodiment. The MR imaging system 110 comprises an MR scanner 112. The MR imaging system 110 is described here generically as a basis for all further embodiments.

The MR imaging system 110 includes a shielded main magnet 200 provided for generating a static magnetic field. The shielded main magnet 200 has a central bore 116 that provides an examination space around a center axis 118 for a subject of interest 120, usually a patient. In this embodiment, the central bore 116 and therefore the static magnetic field of the shielded main magnet 200 have a horizontal orientation in accordance with the center axis 118. In an alternative embodiment, the orientation of the shielded main magnet 200 can be different, e.g. to provide the static magnetic field with a vertical orientation. Further, the MR imaging system 110 comprises a magnetic gradient coil system 122. The magnetic gradient coil system 122 comprises a set of gradient coils for generating gradient magnetic fields superimposed to the static magnetic field provided by the shielded main magnet 200. The magnetic gradient coil system 122 is concentrically arranged within the bore of the shielded main magnet 200, as known in the art. A detailed description of the shielded main magnet 200 is provide below with respect to FIGS. 2 to 4.

Further, the MR imaging system 110 includes a radio frequency (RF) coil 140 designed as a whole-body coil having a tubular body. In an alternative embodiment, the RF coil 140 is designed as a head coil or any other suitable coil type for use in MR imaging systems 110. The RF coil 140 is provided for applying an RF magnetic field to the examination space 116 during RF transmit phases to excite nuclei of the subject of interest 120, which shall be covered by MR images. The RF coil 140 is also provided to receive MR signals from the excited nuclei during RF receive phases. In a state of operation of the MR imaging system 110, RF transmit phases and RF receive phases are taking place in a consecutive manner. The RF coil 140 is arranged concentrically within the bore 116 of the main magnet 114. As is known in the art, a cylindrical metal RF screen 124 is arranged concentrically between the shielded main magnet 200 and the RF coil 140.

In this context, it is to be noted that the RF coil 140 has been described as transmit and receive coil. Nevertheless, the RF coil 140 can also be provided as transmit or receive coil only. In some embodiments, the RF coil 140 can be omitted.

Moreover, the MR imaging system 110 comprises an MR image reconstruction unit 130 provided for reconstructing MR images from the acquired MR signals and an MR imaging system control unit 126 with a monitor unit 128 provided to control functions of the MR scanner 112, as is commonly known in the art. Control lines 132 are installed between the MR imaging system control unit 126 and an RF transmitter unit 134 that is provided to feed RF power of an MR radio frequency to the RF antenna device 140 via an RF switching unit 136 during the RF transmit phases. The RF switching unit 136 in turn is also controlled by the MR imaging system control unit 126, and another control line 138 is installed between the MR imaging system control unit 126 and the RF switching unit 136 to serve that purpose. During RF receive phase, the RF switching unit 136 directs the MR signals from the RF coil 140 to the MR image reconstruction unit 130 after pre-amplification.

Figure 2:
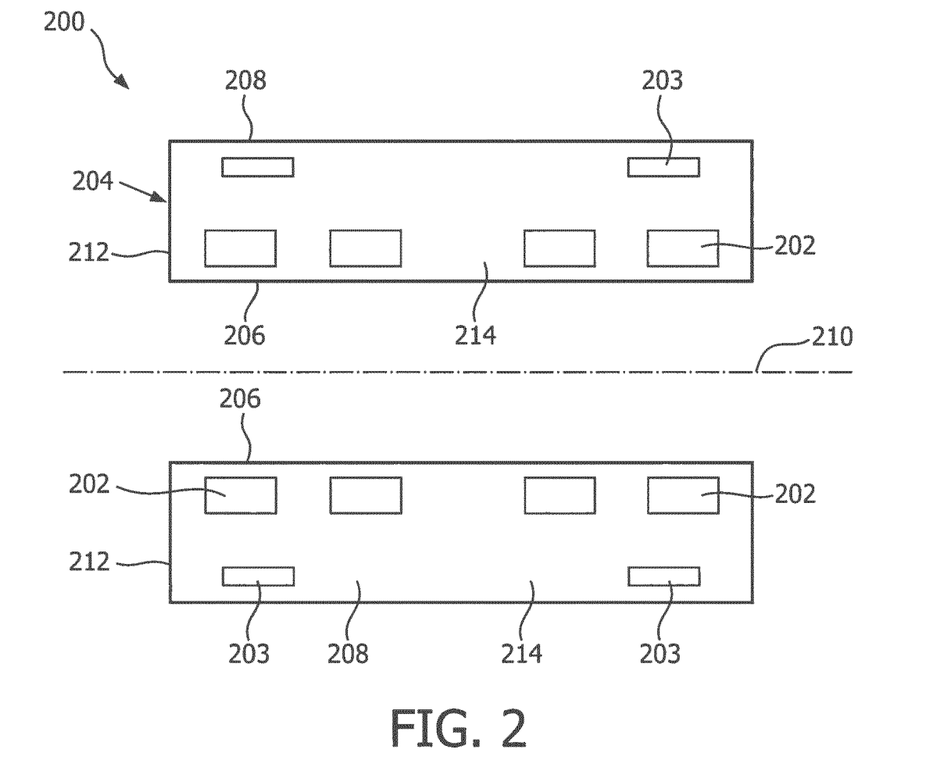
FIG. 2 shows a shielded main magnet with a radiation shield and main coils and active shield coils arranged within the radiation shield according to the first embodiment as a sectional view along its longitudinal axis.
Figure 3:
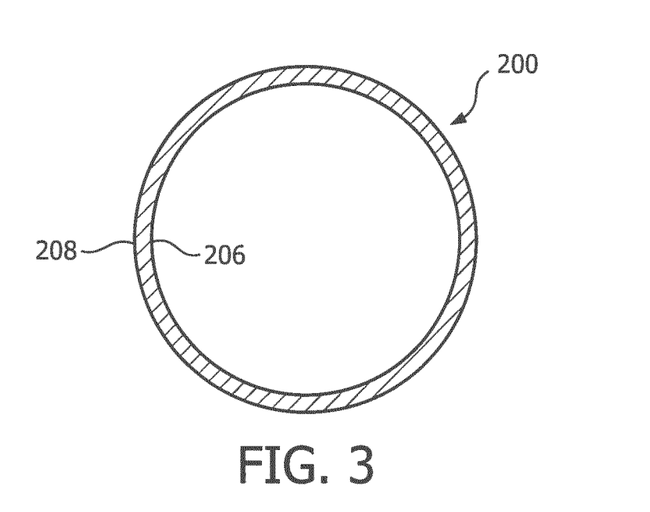
FIG. 3 shows the shielded main magnet according to the first embodiment as a cross sectional view.
Figure 4:
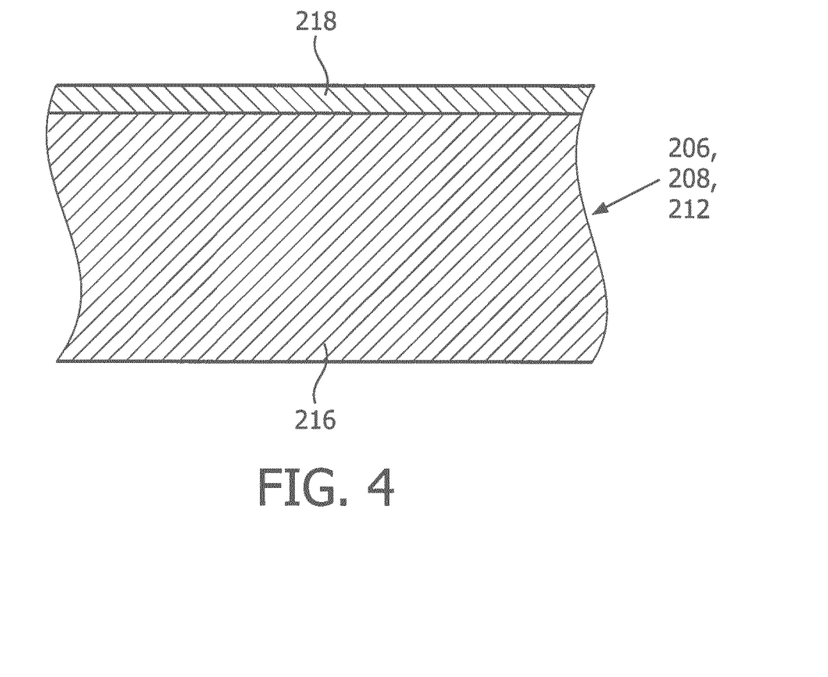
FIG. 4 shows a detailed view of a cylindrical wall of the radiation shield according to the first embodiment as a cross sectional view.

FIGS. 2 to 4 refer to a shielded main magnet 200 according to the first, preferred embodiment for use in the above described MR imaging system 110. The shielded main magnet 200 comprises a set of main coils 202 for generating a static magnetic field in the MR imaging system 110. In this embodiment, the shielded main magnet 200 comprises in addition to the main coils 202 a set of active shield coils 203, which are located co-axially outside the main coils 202, and which are electrically connected in a direction opposite to the main coils 202.

The shielded main magnet 200 further comprises a radiation shield 204. The radiation shield 204 comprises an inner cylindrical wall 206, an outer cylindrical wall 208, which are arranged essentially concentrically to each other along a common longitudinal axis 210, and two ring-shaped base walls 212, which interconnect the inner cylindrical wall 206 and the outer cylindrical wall 208. The radiation shield 204 comprises a cavity 214, which is provided between the inner cylindrical wall 206, the outer cylindrical wall 208, and the two ring-shaped base walls 212. The main coils 202 and the active shield coils 203 are housed in the cavity 214.

As can be best seen in FIG. 4, the inner cylindrical wall 206, the outer cylindrical wall 208, and the two ring-shaped base walls 212 are provided with an inner layer 216, which faces the cavity 214, and an outer layer 218. The inner layer 216 is a layer comprising carbon fiber reinforced plastic, whereby the inner layer 216 comprises multiple layers of CFRP. The inner layer 216 is manufactured by applying multiple layers of CFRP on top of each other to obtain a desired shape of the inner layer 216. In the manufacturing process, fibers of the carbon fiber reinforced plastic of the inner layer 216 are commonly aligned in the direction of the longitudinal axis 210 of the inner cylindrical wall 216 and the outer cylindrical wall 218. In this embodiment, the inner layer 216 is provided with a uniform thickness of less than 3 mm.

The outer layer 218 comprises a metal, which is paramagnetic or diamagnetic. In this embodiment, the metal is aluminum. In an alternative embodiment, the metal of the outer layer is chosen to be silver or copper. According to this embodiment, the outer layer 218 is provided as a coating on the inner layer 216. Hence, the coating is applied to the inner layer 216 to form the outer layer 218 directly thereon. In this embodiment, the outer layer 218 is sputtered on the inner layer 216. In an alternative embodiment, the outer layer 218 is applied on the inner layer 216 by first applying a thin layer of a special paint and subsequent electroplating (galvanization) of a metal coating as outer layer 218. In this embodiment, the outer layer 218 is provided with a thickness of approximately 10 μm.

Figure 5:
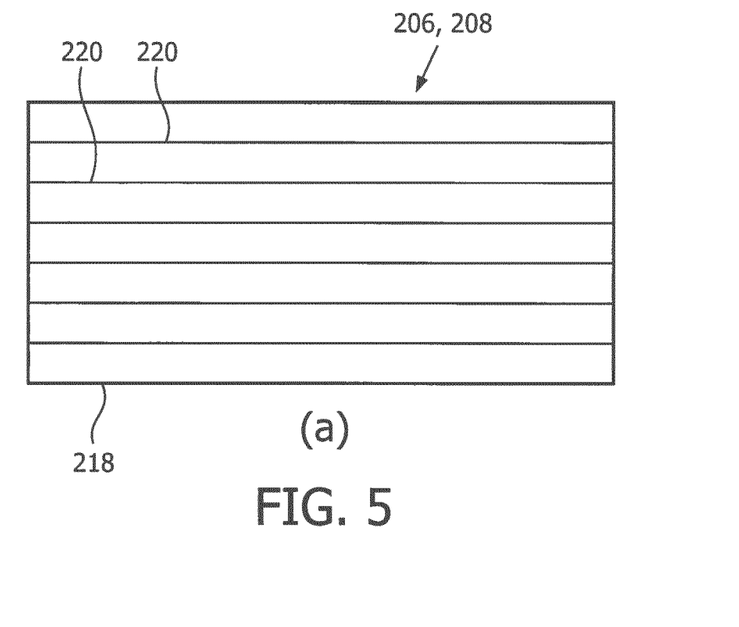
FIG. 5 shows a surface of a cylindrical wall of the radiation shield according to a second embodiment with longitudinal slits as a top view.
Figure 6:
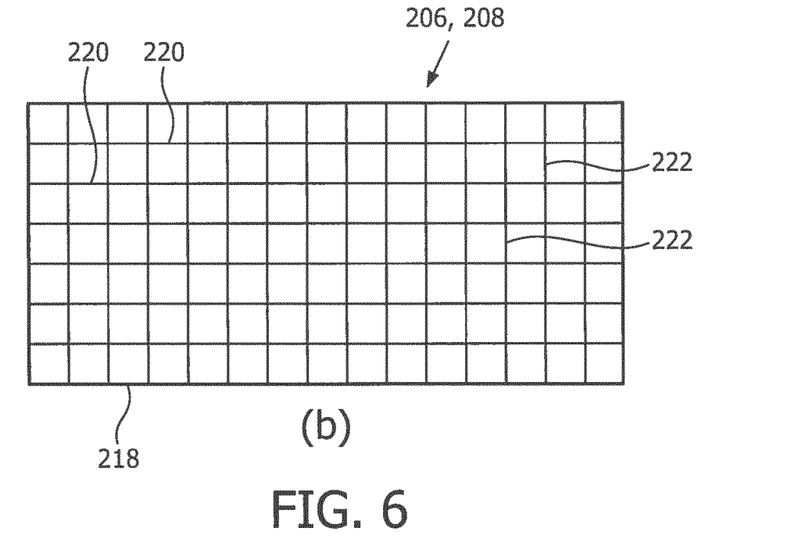
FIG. 6 shows a surface of a cylindrical wall of the radiation shield according to a third embodiment with longitudinal and azimuthal slits as a top view.
Figure 7:
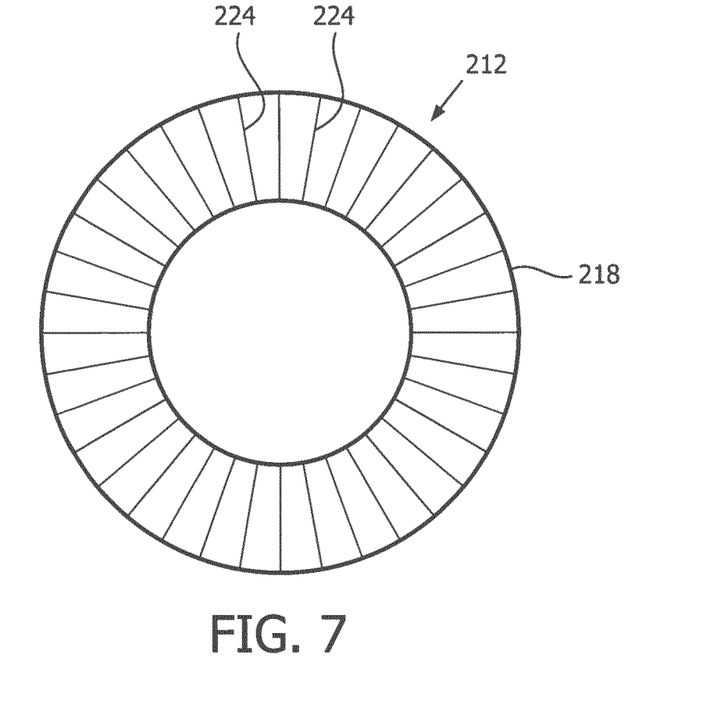
FIG. 7 shows a surface of base wall of the radiation shield according to a fourth embodiment with radial slits as a top view.

FIGS. 5 to 7 refer to detailed embodiments of the radiation shield 204 based on the radiation shield 204 of the first embodiment. Hence, the features of the radiation shield 204 of the first embodiment equally apply to the radiation shield 204 of the embodiments 2 to 4. Only additional features of the radiation shield 204 of the further embodiments are discussed.

As can be seen in FIG. 5 with respect to a second embodiment, the outer layer 218 of the inner cylindrical wall 206 and the outer cylindrical wall 208 is provided with axial slits 220 extending in the longitudinal direction 210 of the radiation shield 204 along the entire length thereof. The axial slits 220 are equally spaced apart in a circumferential direction.

As can be seen in FIG. 6 with respect to a third embodiment, the outer layer 218 of the inner cylindrical wall 206 and the outer cylindrical wall 208 is provided with annular slits 222 extending in a circumferential direction of the radiation shield 204. The annular slits 222 are provided along the inner and/or outer cylindrical wall 206, 208. The annular slits 222 are spaced apart in the longitudinal direction 210 of the radiation shield 204. The annular slits 222 are equally spaced apart along the longitudinal axis of the radiation shield 204.

As can be seen in FIG. 7 with respect to a fourth embodiment, the outer layer 218 of the ring-shaped base walls 212 is provided with radial slits 224 in respect to a center of the ring-shaped base wall 212. The radial slits 224 are equally spaced apart in a circumferential direction of the radiation shield 204.

A method for producing the radiation shield 204 in accordance with the first embodiment comprises the steps of providing a cavity 214 for housing the main coils 202, whereby the cavity 214 is formed between the inner cylindrical wall 206, the outer cylindrical wall 208, and the two ring-shaped base walls 212, and providing the inner cylindrical wall 206, the outer cylindrical wall 208, and the two ring-shaped base walls 212 with an inner layer 216, which faces the cavity 214, and the outer layer 218. In more detail, the step of providing the inner cylindrical wall 206, the outer cylindrical wall 208, and the two ring-shaped base walls 212 with an inner layer 216 comprises the step of providing the inner layer 216 with carbon fiber reinforced plastic, and the step of providing the inner cylindrical wall 206, the outer cylindrical wall 208, and the two ring-shaped base walls 212 with an outer layer 218 comprises the step of providing the outer layer 218 with a metal, which is paramagnetic or diamagnetic.

In this embodiment, the step of providing a cavity 214 for housing the main coils 202 comprises housing the active shield coils 203.

According to the second to fourth embodiment, the method comprises the additional step of providing axial slits 220, annular slits 222, and/or radial slits 224 in the inner cylindrical wall 206, the outer cylindrical wall 208, and/or the two base walls 212 as discussed above with respect to the respective second to fourth embodiment.

According to a preferred embodiment, the step of providing the inner cylindrical wall 206, the outer cylindrical wall 208, and the two ring-shaped base walls 212 with an outer layer 218 comprises the step of providing the outer layer 218 as a coating on the inner layer 216. Preferably, the step of providing the outer layer 218 as a coating on the inner layer 216 comprises applying the outer layer 218 with axial slits 220, annular slits 222, and/or radial slits 224 in the inner cylindrical wall 206, the outer cylindrical wall 208, and/or the two base walls 212 as discussed above with respect to the respective second to fourth embodiment.

Figure 8:
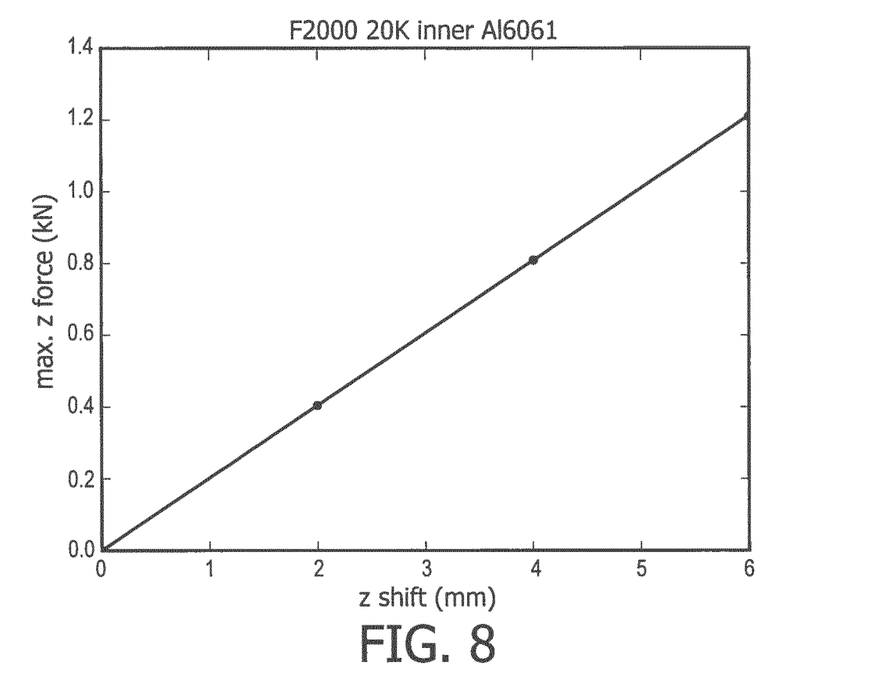
FIG. 8 shows a diagram of a quench behavior of a standard 20K radiation shield with a maximum axial force during quench for a slightly displaced radiation shield.
Figure 9:
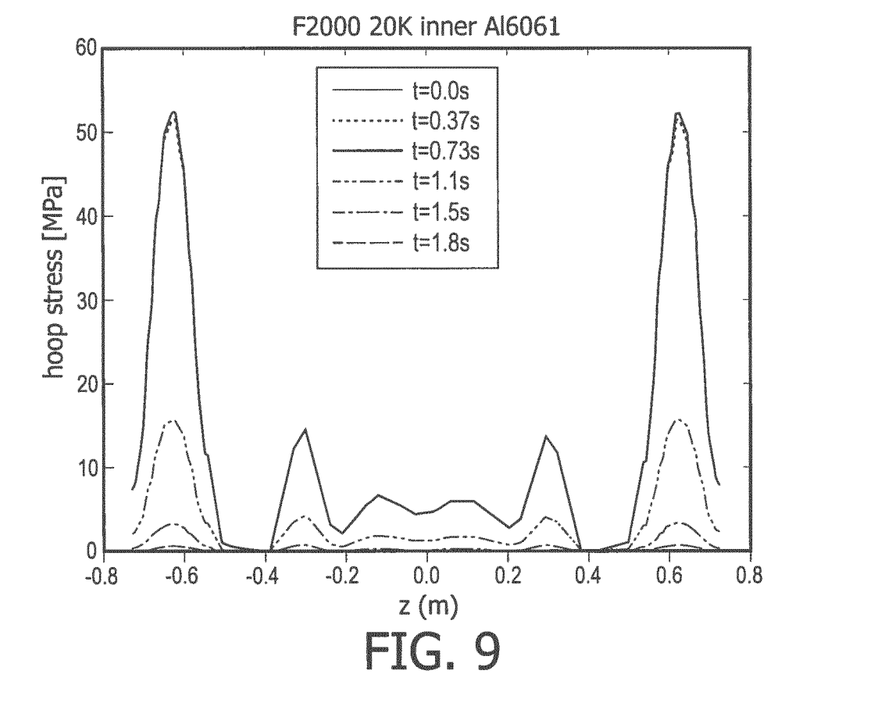
FIG. 9 shows a diagram indicating hoop stress of the standard 20K radiation shield at different times during quench along the longitudinal axis thereof (z-axis)

As an example of the effectiveness of the shielded main magnet 200 and the radiation shield 204 according to the first embodiment, FIGS. 8 to 11 show calculated forces and pressures acting on a 20K for different radiation shields during a quench. FIG. 8 indicates net axial forces for a slightly displaced cylinder of the radiation shield along the longitudinal axis 210 compared to a perfectly symmetric positioning when using a conventional radiation shield. FIG. 9 indicates the radial hoop stress using a conventional radiation shield. As can be seen for the conventional radiation shield made of aluminum, in the case of a Quench, the radiation shield is asymmetrically position along the longitudinal axis 210, so that at both sides a different current is induced, resulting in a net force along the longitudinal direction 210. Hence, the occurring forces require a solid mounting and a increased material thickness to avoid damage.

Figure 10:
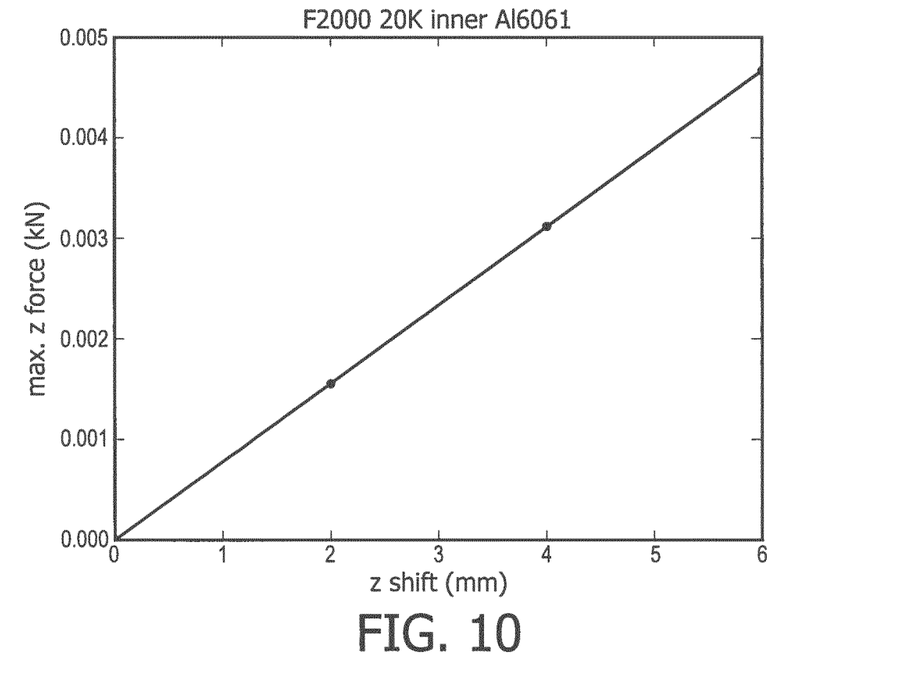
FIG. 10 shows a diagram of a quench behavior of a 20K radiation shield in accordance with the embodiments of FIGS. 2 to 7 with a maximum axial force during quench for a slightly displaced radiation shield.
Figure 11:
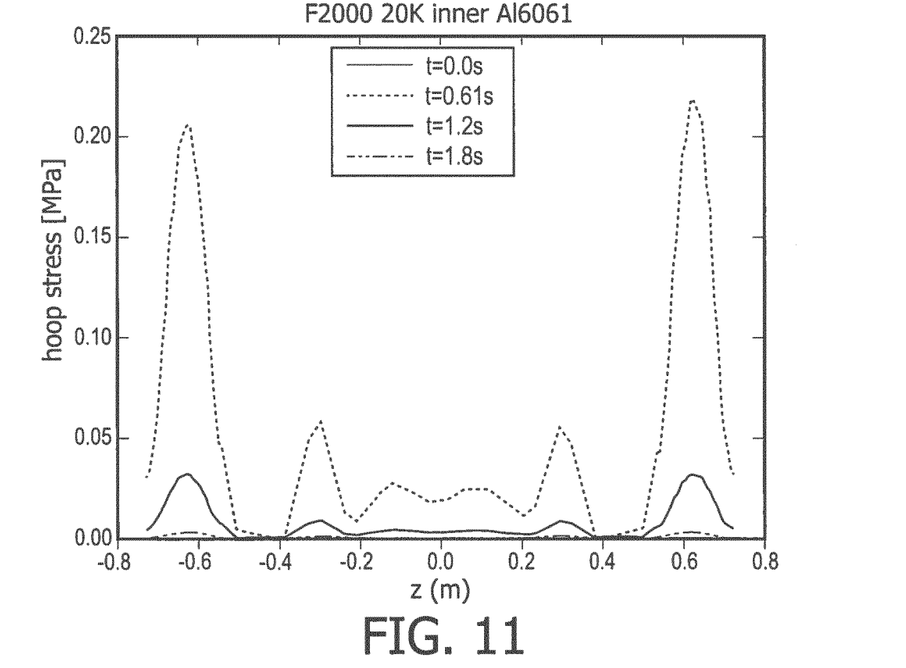
FIG. 11 shows a diagram indicating hoop stress of a 20K radiation shield in accordance with the embodiments of FIGS. 2 to 7 at different times during quench along the longitudinal axis thereof (z-axis).

FIG. 10 indicates net axial forces for a slightly displaced cylinder of the radiation shield 204 along the longitudinal axis 210 compared to a perfectly symmetric positioning when using a radiation shield 204 according to the first embodiment. FIG. 11 indicates the radial hoop stress using a radiation shield 204 according to the first embodiment. As can be seen for the radiation shield 204 according to the first embodiment, in the case of a Quench, according to FIGS. 10 and 11, the forces exhibited by a radiation shield 204 according to the first embodiment are 2-3 orders of magnitude smaller. This reduces the mechanical load on the shielded main magnet 200 and the radiation shield 204 significantly.

The calculation of the net axial forces of FIGS. 10 and 11 has been performed for the radiation shield of the first embodiment. Hence, the outer layer 218 is provided without slits 220, 222, 224. Consequently, when providing the outer layer 218 with slits 220, 222, 224 according to the second, third and fourth embodiment, the forces will become still smaller.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST 110 magnetic resonance (MR) imaging system
112 magnetic resonance (MR) scanner
116 RF examination space
118 center axis
120 subject of interest
122 gradient coil system
124 RF screen
126 MR imaging system control unit
128 monitor unit
130 MR image reconstruction unit
132 control line
134 RF transmitter unit
136 RF switching unit
138 control line
140 radio frequency (RF) antenna device
200 shielded main magnet
202 main coil
203 active shield coil
204 radiation shield
206 inner cylindrical wall
208 outer cylindrical wall
210 longitudinal axis, axial direction
212 base wall
214 cavity
216 inner layer
218 outer layer
220 axial slits
222 annular slits
224 radial slits

The invention claimed is:

1. A radiation shield for shielding main coils of a magnetic resonance imaging system,
the radiation shield comprising:
a cavity for housing at least one main coil, whereby the cavity is formed between an inner cylindrical wall, an outer cylindrical wall, which are arranged essentially concentrically to each other, and two ring-shaped base walls, which interconnect the inner cylindrical wall and the outer cylindrical wall, wherein
at least one out of the inner cylindrical wall and the outer cylindrical wall is provided at least partially with an inner layer, which faces the cavity, and an outer layer,
the inner layer is a layer comprising carbon fiber reinforced plastic, the outer layer comprising a metal, which is paramagnetic or diamagnetic and
the fibers of the carbon fiber reinforced plastic of the inner layer provided on the at least one out of the inner cylindrical wall and the outer cylindrical wall are commonly aligned in an axial direction of the respective inner cylindrical wall and the outer cylindrical wall.

2. The radiation shield according to claim 1, wherein the outer layer is provided as a coating on the inner layer.

3. The radiation shield according to preceding claim 2, wherein
the outer layer is a layer sputtered on the inner layer.

4. The radiation shield according to claim 1, wherein the outer layer is a layer made of aluminum or an alloy comprising aluminum.

5. The radiation shield according to claim 1, wherein the outer layer is a layer having a thickness of less than 1 mm.

6. The radiation shield according to claim 5, wherein the outer layer is a layer having a thickness of less than 100 µm.

7. The radiation shield according to claim 6, wherein the outer layer is a layer having a thickness of less than 20 µm.

8. The radiation shield according to claim 1, wherein the inner layer is a layer having a thickness of less than 10 mm.

9. The radiation shield according to claim 8, wherein the inner layer is a layer having a thickness of less than 5 mm.

10. The radiation shield according to claim 9, wherein the inner layer is a layer having a thickness of less than 3 mm.

11. The radiation shield according to claim 1, wherein the outer layer is provided with slits to prevent eddy-currents.

12. The radiation shield according to preceding claim 11, wherein
the outer layer of at least one out of the inner cylindrical wall and the outer cylindrical wall is provided with axial slits extending along a longitudinal axis of the radiation shield.

13. The radiation shield of claim 1, wherein the two ringed-shaped base walls are provided at least partially with the inner layer, which faces the cavity and the outer layer.

14. The radiation shield according to claim 13, wherein the outer layer of at least one out of the inner cylindrical wall, the outer cylindrical wall and the two the ring-shaped base walls is provided with annular slits extending in a circumferential direction of the radiation shield.

15. The radiation shield according to claim 13, wherein the outer layer of at least one of the ring-shaped base walls is provided with radial slits in respect to a center of the respective ring-shaped base wall.

16. A shielded main magnet comprising:
at least one main coil for generating a static main magnetic field in a magnetic resonance imaging system, and
a radiation shield according to claim 1, wherein
the at least one main coil is housed in the cavity of the radiation shield.

17. A magnetic resonance imaging system comprising:
a shielded main magnet according to claim 16.

18. A method for producing a radiation shield for shielding main coils of a magnetic resonance imaging system, comprising the steps of:
providing a cavity for housing at least one main coil, whereby the cavity is formed between an inner cylindrical wall, an outer cylindrical wall, which are arranged essentially concentrically to each other, and two ring-shaped base walls, which interconnect the inner cylindrical wall and the outer cylindrical wall, and
providing at least one out of the inner cylindrical wall and the outer cylindrical wall at least partially with an inner layer, which faces the cavity, and an outer layer, wherein:
the step of providing at least one out of the inner cylindrical wall and the outer cylindrical wall at least partially with an inner layer comprises the step of providing the inner layer with carbon fiber reinforced plastic, and
the step of providing at least one out of the inner cylindrical wall and the outer cylindrical wall at least partially with an outer layer comprises the step of providing the outer layer with a metal, which is paramagnetic or diamagnetic, and commonly aligning the fibers of the carbon fiber reinforced plastic of the inner layer provided on the at least one out of the inner cylindrical wall and the outer cylindrical wall in an axial direction of the respective inner cylindrical wall and the outer cylindrical wall.

19. The method of claim 18, further including providing the two ringed-shaped base walls at least partially having the inner layer, which faces the cavity and the outer layer.

\* \* \* \* \*